(12) United States Patent
Aue

(10) Patent No.: US 10,049,731 B2
(45) Date of Patent: Aug. 14, 2018

(54) PERIODIC REFRESH OF A MEMORY AREA OF A NON-VOLATILE MEMORY UNIT USING REFRESH TRIGGERS

(71) Applicant: Robert Bosch GmbH, Stuttgart (DE)

(72) Inventor: Axel Aue, Korntal-Muenchingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/718,343

(22) Filed: May 21, 2015

(65) Prior Publication Data

US 2015/0364190 A1 Dec. 17, 2015

(30) Foreign Application Priority Data

Jun. 11, 2014 (DE) .................... 10 2014 211 111

(51) Int. Cl.
*G11C 13/00* (2006.01)
*G06F 11/10* (2006.01)
*G11C 16/34* (2006.01)

(52) U.S. Cl.
CPC ...... *G11C 13/0033* (2013.01); *G06F 11/1004* (2013.01); *G11C 13/0002* (2013.01); *G11C 13/0004* (2013.01); *G11C 16/349* (2013.01); *G11C 16/3418* (2013.01); *G11C 16/3431* (2013.01); *G11C 16/3495* (2013.01)

(58) Field of Classification Search
CPC ............ G11C 13/0033; G11C 16/3431; G11C 16/3418; G11C 13/0002; G11C 13/0004; G11C 16/3495; G11C 16/349
See application file for complete search history.

(56) References Cited

U.S. PATENT DOCUMENTS

| 6,044,004 A * | 3/2000 | Kramer | G11C 7/1045 365/185.03 |
|---|---|---|---|
| 7,551,478 B2 * | 6/2009 | Kanno | G06F 11/1068 365/185.09 |
| 2008/0084738 A1 * | 4/2008 | Philipp | G11C 11/5678 365/185.03 |
| 2009/0144489 A1 * | 6/2009 | Watanabe | G11C 16/3418 711/103 |
| 2010/0058018 A1 * | 3/2010 | Kund | G11C 7/04 711/167 |
| 2011/0219203 A1 * | 9/2011 | Nurminen | G11C 7/04 711/165 |
| 2013/0003451 A1 * | 1/2013 | Bedeschi | G11C 16/3418 365/163 |
| 2013/0007344 A1 * | 1/2013 | Belgal | G06F 12/0246 711/103 |
| 2013/0238836 A1 * | 9/2013 | Suzuki | G11C 16/3431 711/103 |
| 2015/0134888 A1 * | 5/2015 | Kimberly | G11C 11/40611 711/103 |

* cited by examiner

*Primary Examiner* — Pho M Luu
*Assistant Examiner* — Jerome Leboeuf
(74) *Attorney, Agent, or Firm* — Norton Rose Fulbright US LLP; Gerard Messina

(57) ABSTRACT

A method for carrying out a refresh of a memory area of a non-volatile memory unit of an embedded system includes refreshing the memory area when a refresh-triggering criterion is satisfied, a check being performed at predefined time intervals to determine whether the refresh-triggering criterion is satisfied, the embedded system being automatically activated and the check being performed if the embedded system is deactivated following the expiration of any of the predefined time intervals.

27 Claims, 1 Drawing Sheet

PERIODIC REFRESH OF A MEMORY AREA OF A NON-VOLATILE MEMORY UNIT USING REFRESH TRIGGERS

FIELD OF THE INVENTION

The present invention relates to a method for carrying out a refresh of a memory area of a non-volatile memory unit of an embedded system.

BACKGROUND

Non-volatile random access memory units (NVRAM) are used to store data permanently. Although non-volatile memory units maintain the memory content even without a supply of current, the memory content nevertheless dissipates sooner or later depending on its type (flash memory, magnetoresistive random access memory (MRAM), phase change memory (PCM), resistive random access memory (RRAM) or ferroelectric random access memory (FRAM)). Even non-volatile memory units must therefore be refreshed every once in a while.

In non-volatile memory units, so-called refreshes of the memory content stored therein are performed at certain time intervals in order to maintain the memory content. For this purpose, the memory content of the memory area is read in and the corresponding memory area is again overwritten with this read-in memory content.

A use of such non-volatile memory units in embedded systems, for example in a motor vehicle, proves to be problematic especially due to these refreshes.

A loss of the memory contents can result in a failure of the entire embedded system, which represents a high safety risk. For example, a sudden failure of an embedded system of a motor vehicle, for example of an engine control unit, represents a danger for occupants of the motor vehicle and other road users. Such a sudden failure can result in a driver of the motor vehicle losing control of the vehicle.

It is therefore desirable to prevent a loss of memory contents or indeed a failure of the embedded system.

SUMMARY

The period of time, after which the memory content of a memory area of the non-volatile memory units can no longer be read out correctly, resulting in a loss of data, depends, among other things, on the temperature of the non-volatile memory unit. The higher the temperature of the non-volatile memory unit, the sooner it becomes impossible to read out the memory contents correctly. Thus, the higher the temperature of the non-volatile memory unit, the more frequently should a refresh be performed.

Embedded systems, for example in a motor vehicle, are usually exposed to high temperatures. In motor vehicles, embedded systems, for example control units, are exposed to high temperatures especially in the area of the engine compartment. The non-volatile memory units of the embedded system are thus also usually operated under high temperatures. For this reason, refreshes of the memory areas of the non-volatile memory units should be performed at comparatively short time intervals in order to prevent a loss of the memory contents on account of the high temperature.

Example embodiments of the present invention provide a method for performing a refresh of a memory area of a non-volatile memory unit of an embedded system.

In an example embodiment, the embedded system is a control unit, and the non-volatile memory unit includes one or multiple memory areas or memory blocks. All memory areas are capable of having different memory contents written into them and are capable of being written to and read out independently of each other. All memory areas analogously can be refreshed, that is, a memory refresh of the memory content stored in the respective memory area can be performed.

According to the present invention, a check is performed at specifiable time intervals to determine whether a refresh-triggering criterion is fulfilled. If this refresh-triggering criterion is fulfilled, then the refresh of the memory area of the non-volatile memory unit is performed.

If the embedded system is deactivated following the passage of the specifiable time interval, if it is in a sleep mode for example, an energy-saving mode or is switched off completely, then the embedded system is reactivated automatically, for example by a wake-up timer, and the check is triggered. For this purpose, in an example embodiment, the wake-up timer supplies the embedded system in particular with current or sends an activation signal to the embedded system. The length of the time interval depends on the memory technology implemented. For example, a data loss occurs more quickly in a phase change memory (PCM) than in a magnetoresistive random access memory (MRAM) such that a shorter time interval is selected for a PCM than for an MRAM.

The check of the refresh-triggering criterion is thus performed even when the embedded system is inactive or switched off. The check of the refresh-triggering criterion is thus performed independently of the operating mode in which the embedded system is currently operated.

The present invention makes it possible to perform the refresh of the memory area in the embedded system at time intervals that are optimized to prevent a loss of memory contents and/or a failure of the embedded system. The check as to whether the refresh-triggering criterion is fulfilled determines whether there is an increased risk of an imminent data loss. Using the refresh-triggering criterion, a new evaluation is performed each time as to whether it is necessary or practical to perform the refresh or whether it is possible to wait before performing the refresh. It is thus possible to determine the best time at which the refresh should be performed.

If the embedded system following the expiration of the specifiable time interval is currently operated in a regular operating mode, then the check is triggered preferably in addition to the regular operating mode.

If the refresh-triggering criterion is not fulfilled, then, after the expiration of the specifiable time interval, the embedded system is preferably operated again in the operating mode in which it was prior to the expiration of the time interval. The embedded system is thus either deactivated again or is operated further in the regular operating mode. The specifiable time interval is preferably shortened every time the refresh-triggering criterion is not yet fulfilled.

The refresh-triggering criterion is determined in particular on the basis of factors that directly influence the necessity of a refresh. These are in particular factors that promote or result in a data loss of the memory area. These factors in particular characterize under which operating conditions the embedded system is operated and whether or when it is practical under these operating conditions to perform a refresh. These factors furthermore characterize in particular the non-volatile memory unit or the memory area itself. The non-volatile memory unit or the memory area can be monitored for example with respect to whether signs indicate a possible imminent data loss.

In conventional embedded systems, a refresh of a memory area is usually performed when the embedded system is switched on. An embedded system, however, is usually not switched on as often as a refresh should be performed on account of the high temperatures, especially in a motor vehicle. Thus, in such conventional embedded systems there is a danger of loss of the memory contents of the non-volatile memory unit and a resulting failure of the embedded system.

On account of the present invention, it is not necessary to perform the refresh for example only when the embedded system is switched on. The check of the refresh-triggering criterion according to the present invention and thus the refresh itself are performed independently of whether the embedded system is switched on. This makes it possible to avoid the case where the time intervals between two refreshes are too great and a data loss possibly results as a consequence, thereby reducing the danger of loss of the memory contents of the non-volatile memory units and reducing the failure rate of the embedded system.

In a preferred example embodiment of the present invention, the embedded system is implemented in a motor vehicle. The embedded system is in particular a control unit of the motor vehicle, and the present invention does not limit a refresh of the memory content to only when the control unit is switched on, for example.

Instead, a check is performed on the basis of the refresh-triggering criterion as a function of the operating conditions, under which the embedded system is operated in the motor vehicle, to determine whether it is necessary or practical to perform the refresh. It is thus possible to determine, for the specific operating conditions in the respective motor vehicle, the best possible time at which the refresh should be performed. There is thus no danger of memory contents being lost and of a failure of the embedded system in the motor vehicle. The failure rate of the embedded system is thus reduced.

Control units in a motor vehicle are normally only in operation when the motor vehicle is also in operation and when therefore the control units are required for controlling the motor vehicle. It is therefore particularly important that the control units run stably and that a failure of the control units is prevented. The present invention makes it possible to increase safety in the operation of a motor vehicle and to prevent occupants of the motor vehicle or also other road users from being put at risk because of a loss of memory contents.

In an example embodiment of the present invention, the refresh-triggering criterion is checked in terms of whether a time interval since the most recently performed refresh of the memory area of the non-volatile memory unit reaches a threshold value. The refresh of the memory area is thus performed as a function of the time of the most recently performed refresh. The threshold value describes in particular a specific time interval since the most recently performed refresh, after which there exists an increased risk of an imminent data loss and after which a refresh should be performed.

The threshold value is determined differently for different embedded systems. In particular, the threshold is determined as a function of the respective field of application of the embedded system or of the specific conditions under which the embedded system is operated.

The threshold value is preferably determined as a function of a temperature, in particular of the temperature of the embedded system, and/or of the temperature of the memory area or the non-volatile memory unit. The higher the temperature, the more often the refresh should be performed and the lower the threshold is to be.

Alternatively or additionally, the threshold value is preferably determined as a function of the specific type of non-volatile memory unit. In certain types of non-volatile memory units, memory contents might not be able to be read out correctly any longer even after comparatively short time intervals such that for these non-volatile memory units a refresh should be performed more often and a lower threshold value is determined. For example, a data loss occurs more quickly in the case of PCM than in the case of MRAM such that in particular a lower threshold value is determined for a PCM than for an MRAM.

Alternatively or additionally, the threshold value is preferably determined as a function of an operating mode of the embedded system. In an embedded system, which is actively operated over longer operating times without breaks, a refresh should be performed more often than in an embedded system that is frequently switched off or is operated in a standby or sleep mode. Accordingly, a lower threshold value is determined for an embedded system of the former kind than for an embedded system of the latter kind.

Preferably, as a refresh-triggering criterion, a check is performed to determine whether an evaluation variable dependent on an average temperature reaches a threshold value. In an example embodiment, the average temperature is in particular the temperature at which the embedded system is operated and/or the temperature of the memory area or of the non-volatile memory unit averaged over the operating time of the embedded system or the non-volatile memory unit. The higher the average temperature during the operating time, the sooner the evaluation variable will reach the threshold value and the sooner the refresh of the non-volatile memory unit will be performed anew.

In a preferable example embodiment, the evaluation variable dependent on the average temperature is determined as a sum of individual average temperatures over individual time intervals (particularly time intervals of equal length). In particular, the process of summing begins immediately following the performance of the refresh. For example, immediately following the performance of the refresh, the evaluation variable has the value of zero, and following the expiration of each time interval, the respective value of the average temperature (averaged over the expired time interval) is added to the evaluation variable.

The higher the average temperature over the individual time intervals, the sooner the evaluation variable will reach the threshold value and the sooner the refresh of the non-volatile memory unit will be performed anew.

In a preferable example embodiment, as the refresh-triggering criterion, a check is performed as to whether a number of faulty bits in the non-volatile memory unit reaches a threshold value. In particular, an error correction or error detection method is carried out in order to detect faulty bits in the non-volatile memory unit. For this purpose, the number of faulty bits can be determined in the entire non-volatile memory unit or only in specific data blocks.

The faulty bits in the non-volatile memory unit are preferably determined or detected using an error correcting code (ECC). For this purpose, an additional redundancy (for example in the form of additional bits) can be added to individual data words in the non-volatile memory unit. These additional bits can be used to determine errors and to detect faulty bits in the individual data words. Data words are understood here as a suitable number of bits.

Using the error correcting code, one-bit-errors, that is, one faulty bit in a data word, can be both detected as well as corrected. With the aid of an error correcting code it is thus possible to correct one-bit errors without having to perform a refresh of the non-volatile memory unit. Two-bit errors or n-bit errors, that is, two or more than two faulty bits in a data word, however, can only be detected, but not corrected, using the error correcting code. In the case of a two-bit error, two irreparably faulty bits thus occur in one data word. A two-bit error also can no longer be rectified by a refresh and results in a data loss. A corresponding memory content can no longer be read out correctly.

The threshold value for the number of faulty bits in the non-volatile memory unit is determined in such a way (determined to be in particular sufficiently high) that individual one-bit errors within different data words can still be corrected using the error correcting code without requiring a refresh. Thus refreshes are not performed unnecessarily often, and it is possible to rectify the faulty bits in the non-volatile memory unit even by way of the error correcting code.

With an increasing occurrence of one-bit errors in the non-volatile memory unit, however, the probability increases that two or more one-bit errors occur in the same data word and that thus a two-bit error occurs, which cannot be rectified by a refresh. The threshold value for the number of faulty bits in the non-volatile memory unit therefore continues to be determined in such a way (particularly sufficiently low) that a two-bit error does not occur.

According to a preferred example embodiment, the refresh-triggering criterion is a check to determine whether the memory area of the non-volatile memory unit has lost electrical charges, in particular since the most recently performed refresh of the memory area of the non-volatile memory unit.

In non-volatile memory units, individual bits of the memory content can be stored for example using charge carriers. Depending on the stored charge, a corresponding bit can have the value "1" or "0". By adding charges, a threshold voltage is increased. If this threshold voltage of a bit reaches a first threshold value, then the bit has the value "1", and if the threshold voltage of the bit reaches a second threshold, then the bit has the value "0".

If the threshold voltage falls below the first threshold value for example, which is in particular close to 0 V (for example 0.2 V), then the bit has the value "0". If the threshold voltage exceeds the second threshold value for example, which is in particular close to X V (for example 0.8 X V), then the bit has the value "1".

If the non-volatile memory unit loses electrical charge, then the threshold voltage of the corresponding bit changes as well. A loss of electrical charge in the non-volatile memory unit is thus inferred from the threshold voltage or rather from a change in the threshold voltage.

Advantageously, a read margin is used to determine whether the memory area of the non-volatile memory unit has lost electrical charges. A so-called read margin is a noise margin for reading out the non-volatile memory unit. This noise margin describes by how much the threshold voltage of a bit must exceed the corresponding threshold value so that the value of the bit may be detected reliably and without error as "1" or as "0".

The read margin is thus used to check whether the threshold voltages of the individual bits respectively exceed or fall below the respective threshold value by a sufficient amount in order to determine the value of the bit reliably. If this is no longer the case, then this indicates that the electrical charge has been lost, and a refresh is performed.

In order to read out the non-volatile memory unit, a read-out voltage is applied to individual memory cells of the non-volatile memory unit, which respectively represent in particular one bit. The voltage value of this read-out voltage is in particular between the first and the second threshold value for the threshold voltage, which respectively represent either the value "1" or the value "0" of a corresponding bit. Depending on which value the respective bit has, a current of a different current intensity flows through the respective memory cell.

The memory area is in particular read out initially without the read-out margin. For this purpose, the read-out memory content of the memory area is provided with a checksum. Furthermore, the memory area is read out once by taking into account the read-out margin for the bit value "1" and another time by taking into account the read-out margin for the bit value "0". In these two cases as well, the read-out memory content of the memory area is provided with a checksum. If these three checksums are (at least essentially) identical, no refresh of the memory area is performed. If these three checksums are not identical, however, then a refresh of the memory area is performed.

According to an example embodiment, a processing unit according to the present invention, such as a control unit of a motor vehicle for example, is equipped, particularly in terms of program technology, to carry out a method according to the present invention.

The implementation of the method in the form of software is also advantageous, since this incurs particularly low costs, especially if an executing control unit is also used for other tasks and is therefore present anyway. Suitable data carriers for providing the computer program are, in particular, diskettes, hard disks, flash memories, EEPROMs, CD-ROMs, DVDs, etc. A download of a program via computer networks (Internet, intranet, etc.) is also possible.

The present invention is represented schematically in the drawings on the basis of exemplary embodiments and described in detail below with reference to the drawings. The features mentioned above and the features yet to be explained below can be used, not only in the combination indicated in each case, but also in other combinations or in isolation, without departing from the scope of the present invention, and further advantages and developments of the present invention derive from the description and the enclosed drawings.

DETAILED DESCRIPTION

Figure 1:
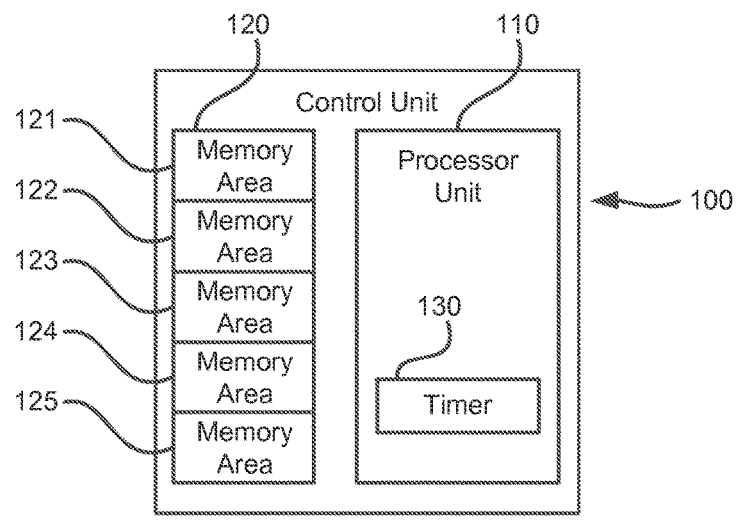
FIG. 1 shows schematically a control unit of a motor vehicle that is designed to carry out a preferred example embodiment of a method according to the present invention.

FIG. 1 schematically shows a control unit 100 of a motor vehicle. Control unit 100 is developed as an embedded system in the motor vehicle. In this specific example, control unit 100 is an engine control unit for controlling an internal combustion engine of the motor vehicle.

Control unit 100 includes a processor unit 110 that is designed to execute specific processes. Control unit 100 furthermore includes a non-volatile memory unit 120. Non-volatile memory unit 120 includes a plurality of memory areas 121 through 125 that are independent of each other.

In this specific example, non-volatile memory unit 120 is a phase change memory (PCM). Non-volatile memory unit 120 can instead be for example a magnetoresistive random access memory (MRAM), a resistive random access memory (RRAM), a ferroelectric random access memory (FRAM) or a flash memory.

In the course of a regular operating mode, processor unit 110 executes processes for controlling the engine of the vehicle, for example in order to determine injection times or a fuel quantity to be injected.

Control unit 100 is furthermore designed to carry out a preferred example embodiment of a method according to the present invention for a memory refresh of the individual memory areas 121 through 125 of non-volatile memory unit 120.

For this purpose, a wake-up timer 130 is implemented in control unit 100. This wake-up timer 130 is in particular a process that is executed by processor unit 110.

Figure 2:
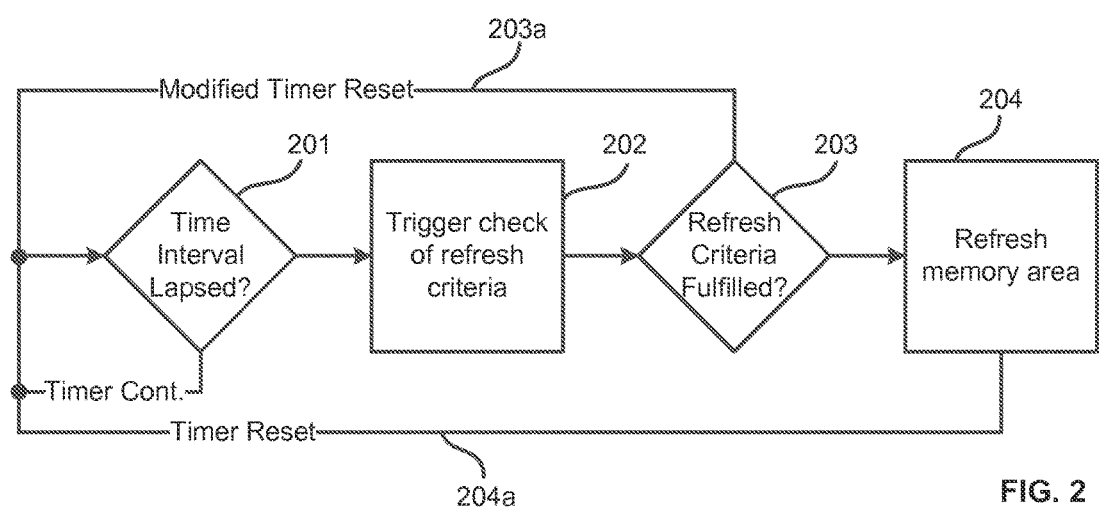
FIG. 2 shows schematically a preferred example embodiment of a method according to the present invention as a block diagram.

The preferred example embodiment of the method according to the present invention is shown in FIG. 2 as a block diagram. The following explains in exemplary fashion with reference to FIGS. 1 and 2 how the control unit 100 performs a refresh of first memory area 121.

In step 201, wake-up timer 130 checks whether a specifiable time interval of one minute for example has elapsed. If this is the case, then wake-up timer 130 triggers a check of refresh-triggering criteria in step 202.

If the control unit in step 202 is operated in the regular operating mode, then wake-up timer 130 triggers the check in addition to this regular operating mode. If the control unit is switched off in step 202 or if the control unit is in a sleep mode in step 202, then wake-up timer 130 first switches the control unit on.

The check of refresh-triggering criteria is performed in step 203. In the process, a check is performed to determine whether at least one of four refresh-triggering criteria is fulfilled.

If none of these refresh-triggering criteria are fulfilled, then the wake-up timer is reset in step 203a and is preferably shortened in the process, by 10% for example. If at least one of these refresh-triggering criteria is fulfilled, then the refresh of the memory area 121 is performed in step 204. Subsequently, the wake-up timer is reset in step 204a.

On the one hand, a check is performed in step 203 to determine whether a time interval since the most recently performed refresh of memory area 121 reaches a threshold value. In this specific example of a non-volatile memory unit 120 developed as a phase change memory, the threshold value is five minutes.

Furthermore, a check is performed in step 203 to determine whether an evaluation variable dependent on an average temperature reaches a threshold value. This evaluation variable is determined and summed up as the average temperature at which control unit 100 is operated during the specifiable time interval. After each executed refresh, the evaluation variable is reset to zero. In this example, the threshold value has the value 500.

If the control unit is constantly operated for example at a temperature of 100° C., then the evaluation variable has the value 100 after the expiration of the time interval of one minute.

After another expiration of a time interval of one minute, the evaluation variable has the value 200.

Furthermore, a check is performed in step 203 to determine whether a number of faulty bits in memory area 121 reaches a threshold value. For this purpose, an error correction code is implemented in order to detect the number of faulty bits. In this example, the threshold value has the value of five.

As the fourth refresh-triggering criterion, a check is performed in step 203 to determine whether memory area 121 has lost electrical charges. For this purpose, memory area 121 is initially read out normally. Subsequently, memory area 121 is read out by taking into account a read-out margin for the bit value "1". For this purpose, the memory area is read out at a specific first load. Subsequently, memory area 121 is read out by taking into account a read-out margin for the bit value "0". For this purpose, the memory area is read out at a specific second load. In these three cases, the read-out memory content 121 is respectively provided with a checksum. If these three checksums are not identical, then this fourth refresh-triggering criterion is fulfilled.

What is claimed is:

1. A method for carrying out a refresh of a memory area of a non-volatile memory unit of a system, the method comprising:
periodically checking, by processing circuitry and responsive to expiration of predefined time intervals, whether at least one refresh-triggering criterion is satisfied;
responsive to the expiration of any of the time intervals that occurs when the system is in a deactivated state by being in a sleep mode, in an energy saving mode, or switched off completely, automatically activating the system for the respective checking to be performed, wherein the step of automatically activating includes automatically terminating the deactivated state of the system and automatically entering an activated state for the system in response to the expiration of any of the time intervals, and wherein the step of automatically terminating the deactivated state is performed before a time for activating the system to perform an operation other than the respective checking;
for each of the checkings for which a result of the checking is that there is satisfaction of any of the at least one refresh-triggering criterion, refreshing, by the processing circuitry, the memory area of the non-volatile memory unit in response to the respective result,
wherein, after the automatically activating of the system, the respective checking is performed prior to any respective refreshing.

2. The method of claim 1, wherein, if the system following the expiration of any of the predefined time intervals is operated in a regular operating mode, the check is carried out in addition to the regular operating mode.

3. The method of claim 1, wherein the automatic activation is by a wake-up timer.

4. The method of claim 1, wherein the at least one refresh-triggering criterion includes that a time interval since a most recently performed refresh of the memory area has reached a threshold value.

5. The method of claim 4, wherein the threshold value varies depending on a temperature of the system.

6. The method of claim 4, wherein the threshold value depends on a type of the non-volatile memory unit of the system.

7. The method of claim 4, wherein the threshold value varies depending on an operating mode of the embedded system.

8. The method of claim 1, wherein the at least one refresh-triggering criterion includes an evaluation variable dependent on whether an average temperature reaches a threshold value.

9. The method of claim 8, wherein the evaluation variable is determined as a sum of individual average temperatures over individual time intervals.

10. The method of claim 1, wherein the at least one refresh-triggering criterion includes whether a number of faulty bits in the memory area reaches a threshold value.

11. The method of claim 10, wherein the faulty bits in the memory area are determined using an error correcting code.

12. The method of claim 1, further comprising using a read-out margin to determine whether the memory area has lost electrical charges, wherein the at least one refresh-triggering criterion includes whether the memory area has lost electrical charges.

13. The method of claim 1, wherein the non-volatile memory unit is a magnetoresistive random access memory (MRAM), a phase change memory (PCM), a resistive random access memory (RRAM), a ferroelectric random access memory (FRAM) or a flash memory.

14. The method of claim 1, wherein the system is embedded in a motor vehicle.

15. The method of claim 7, wherein the threshold value is lowered as the operating times of the system without breaks become longer.

16. The method of claim 7, wherein the threshold value is increased as the system is switched off more frequently.

17. The method of claim 1, wherein the at least one refresh-triggering criterion includes whether the memory area has lost electrical charges, and wherein the at least one refresh-triggering criterion includes whether the memory area has lost electrical charges.

18. A processing unit comprising circuitry, wherein the circuitry is configured to perform a method to refresh a memory area of a non-volatile memory unit of a system, the method comprising:
periodically checking, by processing circuitry and responsive to expiration of predefined time intervals, whether at least one refresh-triggering criterion is satisfied;
responsive to the expiration of any of the time intervals that occurs when the system is in a deactivated state by being in a sleep mode, in an energy saving mode, or switched off completely, automatically activating the system for the respective checking to be performed, wherein the automatically activating includes automatically terminating the deactivated state of the system and automatically entering an activated state for the system in response to the expiration of any of the time intervals, and wherein the step of automatically terminating the deactivated state is performed before a time for activating the system to perform an operation other than the respective checking;
for each of the checkings for which a result of the checking is that there is satisfaction of any of the at least one refresh-triggering criterion, refreshing, by the processing circuitry, the memory area of the non-volatile memory unit in response to the respective result,
wherein, after the automatically activating of the system, the respective checking is performed prior to any respective refreshing.

19. A non-transitory computer readable medium on which are stored instructions that are executable by a processor and that, when executed by the processor, cause the processor to perform a method to refresh a memory area of a non-volatile memory unit of a system, the method comprising:
periodically checking, by processing circuitry and responsive to expiration of predefined time intervals, whether at least one refresh-triggering criterion is satisfied;
responsive to the expiration of any of the time intervals that occurs when the system is in a deactivated state by being in a sleep mode, in an energy saving mode, or switched off completely, automatically activating the system for the respective checking to be performed, wherein the step of automatically activating includes automatically terminating the deactivated state of the system and automatically entering an activated state for the system in response to the expiration of any of the time intervals, and wherein the step of automatically terminating the deactivated state is performed before a time for activating the system to perform an operation other than the respective checking;
for each of the checkings for which a result of the checking is that there is satisfaction of any of the at least one refresh-triggering criterion, refreshing, by the processing circuitry, the memory area of the non-volatile memory unit in response to the respective result,
wherein, after the automatically activating of the system, the respective checking is performed prior to any respective refreshing.

20. The method of claim 1, wherein, prior to the step of automatically activating, determining whether any of the predetermined time intervals has expired while the system is switched off completely.

21. The processing unit of claim 18, wherein, prior to the step of automatically activating, determining whether any of the predetermined time intervals has expired while the system is switched off completely.

22. The non-transitory computer readable medium of claim 19, wherein, prior to the step of automatically activating, determining whether any of the predetermined time intervals has expired while the system is switched off completely.

23. The method of claim 1, wherein the step of periodically checking is performed independently of whether the system is switched on.

24. The processing unit of claim 18, wherein the step of periodically checking is performed independently of whether the system is switched on.

25. The non-transitory computer readable medium of claim 19, wherein the step of periodically checking is performed independently of whether the system is switched on.

26. The processing unit of claim 18, wherein the at least one refresh-triggering criterion includes whether the memory area has lost electrical charges.

27. The non-transitory computer readable medium of claim 19, wherein the at least one refresh-triggering criterion includes whether the memory area has lost electrical charges.

* * * * *